United States Patent [19]

Jouve et al.

[11] Patent Number: 4,535,422

[45] Date of Patent: Aug. 13, 1985

[54] MAGNETIC BUBBLE MEMORY WITH UNIMPLANTED MOTIFS

[75] Inventors: Hubert Jouve, Biviers; Joël Magnin, Saint Martin d'Heres, both of France

[73] Assignee: Commissariat a l'Energie Atomique, Paris, France

[21] Appl. No.: 506,688

[22] Filed: Jun. 22, 1983

[30] Foreign Application Priority Data

Jun. 29, 1982 [FR] France .................................. 82 11407

[51] Int. Cl.³ .............................................. G11C 19/08
[52] U.S. Cl. ........................................ 365/36; 365/19; 365/12
[58] Field of Search .................. 365/15, 12, 19, 20, 365/36

[56] References Cited

U.S. PATENT DOCUMENTS

| | | | |
|---|---|---|---|
| 4,387,443 | 6/1983 | Sakamoto | 365/19 |
| 4,403,304 | 9/1983 | Gergis | 365/12 |
| 4,423,489 | 12/1983 | MacNeal | 365/36 |

FOREIGN PATENT DOCUMENTS

0055582 4/1982 Japan .................................... 365/36

*Primary Examiner*—James W. Moffitt
*Attorney, Agent, or Firm*—Handal & Morofsky

[57] ABSTRACT

The invention relates to a magnetic bubble memory having a first layer of monocrystalline magnetic material with at least one crystallographic axis having the property of being aplanar easy magnetization axis, whereby the first layer has groups of unimplanted, contiguous and aligned motifs, called first motifs, permitting the propagation of the bubbles into a second magnetic layer, positioned below the first magnetic layer, the first motifs being shaped in such a way that two cavities are defined between two first adjacent motifs, wherein each group of first motifs has an axis such that the first motifs of the group are arranged symmetrically with respect to the axis, the groups being arranged parallel to the crystallographic axis of the first layer of material, and wherein it comprises, associated with each group, an electrical conductor, called the first conductor, permitting the duplication of the bubbles, each conductor being arranged perpendicular to the crystallographic axis of the first layer of material, the corresponding group of first motifs being traversed by the conductor.

25 Claims, 5 Drawing Figures

MAGNETIC BUBBLE MEMORY WITH UNIMPLANTED MOTIFS

BACKGROUND OF THE INVENTION

The present invention relates to a magnetic bubble memory with unimplanted motifs.

It more particularly applies to the storage of binary information or bits, materialized in the form of isolated magnetic domains, called bubbles. These generally cylindrical domains have the reverse magnetization to that of the remainder of the magnetic material (garnet) constituting the layer in which these domains are formed. In this memory, the duplication of the magnetic bubbles makes it possible to carry out bit by bit duplication or bit block duplication.

In a monocrystalline magnetic layer, such as a magnetic garnet film, supported by an amagnetic monocrystalline garnet, the magnetic bubbles or domains are stable through the application of a continuous magnetic field Hp perpendicular to the plane of the magnetic layer. In practice, this magnetic layer is created by a permanent magnet, thus ensuring the non-volatility of the information contained in the memory.

In a magnetic bubble memory, the displacement of the bubbles is brought about by applying a rotary continuous field $H_T$ in a direction parallel to the surface of the magnetic layer. The bubbles are displaced around the so-called propagation motif defined in the upper part of the magnetic layer.

These motifs are in the form of disks, lozenges, triangles, T's, etc and can be produced from an iron and nickel-based material, or can be obtained by implanting ions in the upper part of the magnetic layer, across a mask making it possible to define the shape of these motifs. In view of the fact that ion implantation only takes place around the motifs, in the latter case, these motifs are called unimplanted or non-implanted motifs. The propagation motifs are generally contiguous. As a result of their shape, two adjacent motifs define two cavities or hollows between them.

The displacement of the bubbles along these motifs generally takes place for a time equal to one third of the rotation period of the planar magnetic field $H_T$, the bubbles remaining stationary in the cavities defined between two adjacent motifs throughout the remainder of the cycle. In this way, shift registers are obtained in which the binary information 1 is represented by the presence of a bubble and the binary information "o" by the absence of a bubble.

In addition, to these propagation motifs, it is necessary to use electrical conductors for carrying out writing, information recording, non-destructive reading, register-to-register transfer and erasure functions in the bubble memory.

One of the main types of known magnetic bubble memories comprises a system of so-called minor loops or registers used for the storage of information, associated with one or two so-called major loops or registers forming the access stations to the memory. The minor loops are longitudinally juxtaposed and the major loops are oriented perpendicularly to the minor loops. The magnetic bubbles in the minor loops can be transferred into the major loops and vice versa, via unidirectional or bidirectional transfer gates.

When only a single major loop is used, information reading and writing takes place by means of this single loop. In the first case, reference is made to a memory having a major—minor organisation. Conversely, when use is made of two major loops, writing of the information takes place via one of these two loops and reading of the information via the other loop. These major loops are generally located on either side of minor loops. In the latter case of two loops, reference is generally made to a memory having a series—parallel organization.

In the aforementioned bubble memories, the production of a bubble on a major loop, corresponding to the writing of information, is brought about by applying a high current to a generally U-shaped conductor, traversing the propagation motifs constituting the major loops. This operation, generally known as nucleation, is performed when the bubble is in a cavity defined between two adjacent motifs.

Following nucleation, the bubble is then propagated, by the application of a rotary field $H_T$, on the major loop towards the transfer gates, in order to transfer the bubble from the major loop to a minor loop. These transfer gates are generally formed by a U-shaped conductor traversing the motifs forming the minor loop. The application of a current pulse to this conductor makes it possible to extend each bubble between the tops of the propagation motifs and the major loop and those corresponding to the minor loop and then the stopping of the current pulse brings about the contraction of the bubbles on the minor loop. The transfer is then carried out, so that the information is stored on the minor loop.

The reading of this information takes place by transferring a magnetic bubble from a minor loop to a major loop. The transfer takes place in the manner described hereinbefore.

In order to read information in a non-destructive manner, the corresponding bubble must be duplicated. In the case of a bubble by bubble nucleation, said duplication is carried out by means of a conductor passing through the major loop, to which a current pulse is applied, leading to the elongation of the bubble on either side of the propagation paths, followed by the splitting of said bubble into two. One of these bubbles, transferred on a detection path, can be destructively detected by a magnetoresistive detector, generally based on iron and nickel, whilst the other bubble is reinjected into the minor loop at the location occupied by the original bubble.

A bubble memory operating on this principle has been described in U.S. Pat. No. 4,253,159, filed on Dec. 3, 1979 and entitled "ion-implanted bubble memory with replicate port". In this patent, use is made of a single major loop and unimplanted propagation motifs.

Magnetic bubble memories having as their propagation motifs, unimplanted motifs and having a structure and operation of the type described hereinbefore (cf the aforementioned U.S. Patent) only make it possible to carry out a duplication of the bubbles corresponding to a bit by bit duplication. These memories do not make it possible to carry out the duplication of a bit block or group.

SUMMARY OF THE INVENTION

The object of the present invention is a magnetic bubble memory with unimplanted motifs making it possible to obviate this disadvantage.

More specifically, the invention relates to a magnetic bubble memory having a first layer of monocrystalline magnetic material with at least one crystallographic axis having the property of being a planar easy magnetication axis, whereby said first layer has groups of unimplanted, contiguous and aligned motifs, called first motifs, permitting the propagation of the bubbles into a second magnetic layer, positioned below the first magnetic layer, said first motifs being shaped in such a way that two cavities are defined between two first adjacent motifs, wherein each group of first motifs has an axis such that the first motifs of said group are arranged symmetrically with respect to said axis, said groups being arranged parallel to the crystallographic axis of the first layer of material, and wherein it comprises, associated with each group, an electrical conductor, called the first conductor, permitting the duplication of the bubbles, each conductor being arranged perpendicular to the crystallographic axis of the first layer of material, the corresponding group of first motifs being traversed by said conductor.

Preferably, the first motifs have identical shapes and dimensions.

The use of unimplanted propagation motifs arranged symmetrically with respect one one axis and parallel to one of the crystallographic axes of the layer of material containing these motifs, makes it possible to obtain two propagation paths on either side of the said motifs and which are strictly equivalent. In particular, these two propagation paths have identical magnetic properties and equal potential troughs, with respect to the propagation of the bubbles.

Moreover, the relative position of the unimplanted motifs and conductors used for duplication purposes, permits an easy duplication of the magnetic bubbles.

Preferably, each first electrical conductor has an axis of symmetry and is arranged in such a way that said axis of symmetry passes through the two cavities, defined by two first adjacent motifs of the group associated therewith, at the deepest region of said cavities.

According to a preferred embodiment of the bubble memory according to the invention, the first two adjacent motifs of the same group, located at the point where the first associated electrical conductor is arranged, have in each case an implanted region, said regions being positioned symmetrically with respect to the axis of symmetry of the first conductor and symmetrically with respect to the axis of said group of first motifs.

During duplication, the use of such an implanted region facilitates the passage of the bubbles (elongation on either side of the group of motifs, as well as the splitting into two of said bubbles).

In order to permit the propagation and duplication of magnetic bubbles having a diameter of approximately 2 $\mu$m, the distance separating the deepest regions of two cavities, defined between two first adjacent motifs of the same group is preferably between 2 and 20 $\mu$m.

The structure as described hereinbefore can be advantageously used in a bubble memory having a major-minor organisation.

According to the invention, the bubble memory has minor loops used for the storage of bubbles, arranged in juxtaposed manner and each having two ends, said minor loops being formed by contiguous unimplanted propagation motifs, called second motifs, at least one major loop used as an access loop for the minor loops, arranged perpendicularly to the latter, said major loop being formed by contiguous unimplanted propagation motifs, called third motifs, and means for detecting and producing bubbles on the major loop, wherein each minor loop is bent so as to define, at one of its ends, two separate juxtaposed portions, the first portion being used for the injection of bubbles into the minor loop and the second portion for extracting bubbles from said minor loop, and wherein each minor loop is associated with a group of first motifs used for the transfer of bubbles from the corresponding minor loop to the major loop and vice versa, said groups of first motifs having at one of their ends two separate branches, a first branch being used for the injection of bubbles into the corresponding minor loop and a second branch being used for the extraction of bubbles from the corresponding minor loops, said branches, formed by contiguous, aligned, unimplanted propagation motifs, called fourth motifs, being juxtaposed in such a way that the end of the first branch faces the end of the first portion of the corresponding minor loop and the end of the second branch faces the end of the second portion of the corresponding minor loop, the end of the second branch being provided with a unidirectional transfer gate for ensuring the transfer of bubbles from the minor loop to the group of associated motifs.

According to a preferred embodiment of this bubble memory, the fourth end motif of the first branch and the second end motif of the first portion of the minor loop, which face one another are aligned, said alignment forming an angle of close to 30° with the crystallographic axis of the first magnetic layer.

According to another preferred embodiment of the bubble memory, the groups of first motifs have at their other end a bidirectional transfer gate for ensuring the transfer of bubbles from the major loop to the said groups of motifs and vice versa.

In the case of a bubble memory with a series—parallel organization, the memory comprises two major loops, the first facing the bubble detection means and the second facing the means making it possible to produce the bubbles and is such that the groups of first motifs are joined, at their other end, to the first major loop, the latter having openings formed in the third unimplanted motifs forming the same, permitting the transfer of bubbles from the group of first motifs to said major loop and wherein the other end of the minor loops has a transfer gate permitting the transfer of bubbles from these minor loops to the second major loop and vice versa.

The invention also relates to novel means making it possible to produce magnetic bubbles in a bubble memory. These means comprise a group of contiguous, unimplanted propagation motifs, called fifthmotifs, having a shape such that two cavities are defined between two adjacent motifs, part of the said motifs being arranged so as to form a closed loop, the other part constituting a propagation path for the bubbles produced and an electrical conductor, called the second conductor, permitting the duplication of bubbles disposed perpendicularly to the crystallographic axis of the first magnetic layer, said group of fifth motifs being traversed by the second conductor, at the part where they form a closed loop. Preferably, these fifth motifs have identical shapes and dimensions.

These means advantageously make it possible to replace conventional bubble generators operating on the basis of the nucleation principle.

According to a preferred embodiment of these means, the first magnetic layer has three crystallographic axes, the closed loop having the symmetry of order 3 of said magnetic layer.

According to another preferred embodiment of these means, the second electrical conductor has an axis of symmetry and is arranged in such a way that its axis of symmetry through the two cavities, defined by two adjacent fifth motifs, the deepest region of said cavities.

According to another preferred embodiment of these means, the fifth adjacent motifs, positioned at the location of the second electrical conductor, have in each case an implanted region, said regions being disposed symmetrically with respect to the axis of symmetry of the second conductor.

The invention also relates to a process for the duplication of magnetic bubbles using a bubble memory of the type described hereinbefore.

According to the invention, the duplication of the bubbles is obtained by supplying each duplication conductor with at least one current pulse, bringing about the elongation of the bubbles on either side of the group of motifs associated with said conductor and then splitting these bubbles into two.

Preferably, the current supply to the electrical conductors used for duplication is stopped, when the rotary magnetic field applied parallel to the second layer of magnetic material is parallel to the axis of the group of motifs associated with said conductor.

The process according to the invention can be advantageously used for carrying out either the duplication of bits on a bit by bit basis, the duplication being effected by supplying the electrical conductors used for the duplication with successive current pulses, or for the duplication by bit blocks. It should be noted that a duplication by bit blocks, in a magnetic bubble memory having unimplanted propagation motifs could not be realised with the prior art bubble memories.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
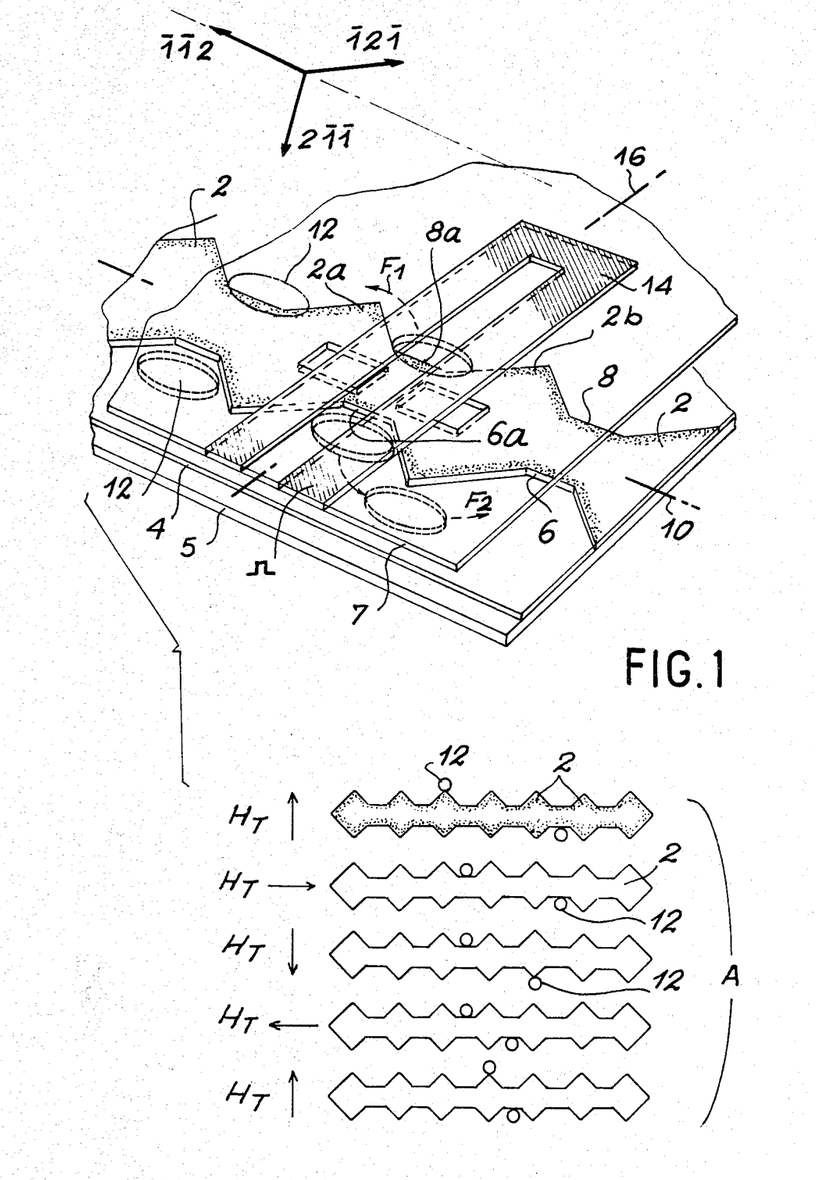
FIG. 1 diagrammatically, part of a bubble memory according to the invention, illustrating the respective arrangement of the unimplanted motifs of said memory with respect to the duplication conductor.

FIG. 1 shows a part of a bubble memory according to the invention, which has a group of unimplanted propagation motifs 2, which are juxtaposed and aligned. These propagation motifs 2 are obtained by ion implantation, through a mask, in a layer of monocrystalline magnetic material 4. This material layer 4, e.g. of garnet epitaxied in direction 111, has three equivalent, easy magnetization, crystallographic axes respectively $\overline{112}$, $\overline{121}$ and $\overline{211}$, as shown at the top of FIG. 1.

The propagation motifs 2 have a shape such that two cavities, respectively 6 and 8, are defined between two adjacent motifs 2, which can be in the form of lozenges, triangles, circles, ellipses, polygons, etc. In FIG. 1, these motifs are shaped like lozenges. Preferably, these propagation motifs have identical shapes and dimensions.

According to the invention, the motifs 2 are arranged symmetrically with respect to the axis 10. Moreover, the group of propagation motifs 2 is arranged parallel to one of the crystallographic axes of the material layer 4, in which said motifs are formed, such as e.g. crystallographic axis $\overline{112}$. The arrangement of the propagation motifs 2 makes it possible to obtain two propagation paths for the magnetic bubbles such as 12, located on either side of the group of strictly equivalent motifs. These two propagation paths are respectively represented by arrows $F_1$ and $F_2$.

The magnetic bubbles 12, located in a magnetic material layer 5 (garnet), positioned below the material layer 4 containing the unimplanted motifs 2, can be displaced by applying a continuous, rotary magnetic field $H_T$, directed parallel to material layer 5. In part A of FIG. 1, it is possible to see the displacement of the magnetic bubbles 12 under the action of magnetic field $H_T$. As shown, the magnetic bubbles ae displaced for a time equal to one third of the rotation period of magnetic field $H_T$.

In addition to the propagation motifs 2, the bubble memory has an electrical conductor 14 "traversing" the group of propagation motifs. In practice, the said conductor is placed on a layer 7, positioned above material layer 4 containing propagation motifs 2 and as shown in FIG. 1. This electrical conductor 14, having e.g. an axis of symmetry 16, is arranged perpendicularly to one of the crystallographic axes of the magnetic material layer 4, e.g. crystallographic axis $\overline{112}$.

Preferably, this e.g. U-shaped conductor 14 is arranged in such a way that its axis of symmetry 16 passes through two cavities 6a, 8a, defined by two adjacent motifs 2a, 2b, at the deepest region of these cavities, and conductor 14 traverses the two adjacent motifs 2a, 2b.

This electrical conductor 14 is used for bringing about the duplication of magnetic bubbles 12. This duplication is generally carried out in order to be able to read the information contained in the memory. The duplication of the magnetic bubbles 12 is carried out by supplying the conductor 14 with at least one current pulse, as shown in the drawing. According to the invention, this current pulse must be applied for a clearly defined phase of magnetic field $H_T$, applied to the material layer 5 containing the magnetic bubbles.

Figure 2:
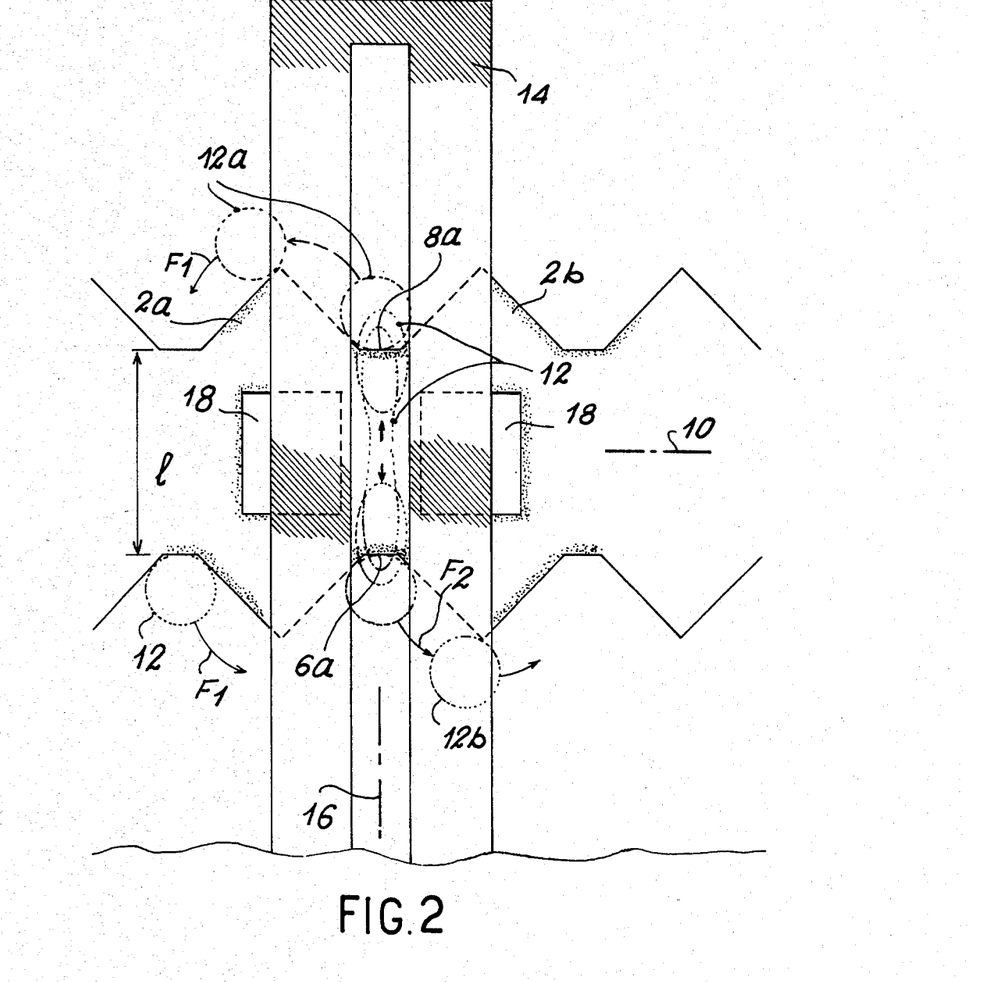
FIG. 2 a larger scale representation of FIG. 1 at the point where the conductor traverses the propagation motifs.

As shown in FIG. 2, this optimum phase occurs when the magnetic bubble to be duplicated 12 is located in one of the cavities 6a or 8a defined between two adjacent motifs 2a, 2b, and traversed by conductor 14. Under these conditions, the application of a current pulse to conductor 14 leads to the elongation of the bubble to be duplicated on either side of the group of motifs 2, as shown in FIG. 2, followed by the splitting of said bubble into two. Equivalently, the stopping of the power supply takes place when the magnetic field $H_T$ is parallel to axis 10 of the group of propagation motifs 2. One of the bubbles 12a obtained by duplication passes along the propagation $F_1$, in order to be detected, and the other bubble 12b obtained by duplication, is passed along propagation path $F_2$ into the storage registers of the memory.

Figure 3:
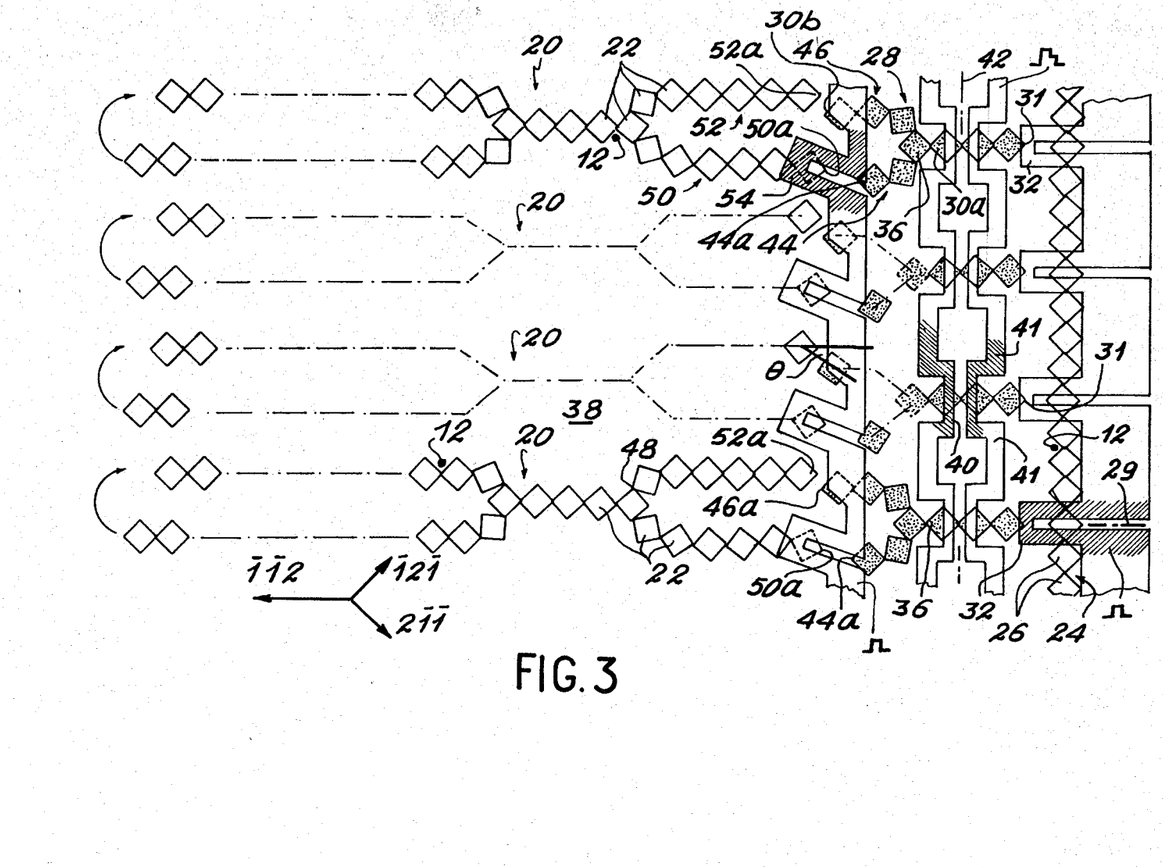
FIG. 3 diagrammatically a bubble memory according to the invention with several minor loops associated with a single major loop.
Figure 4:
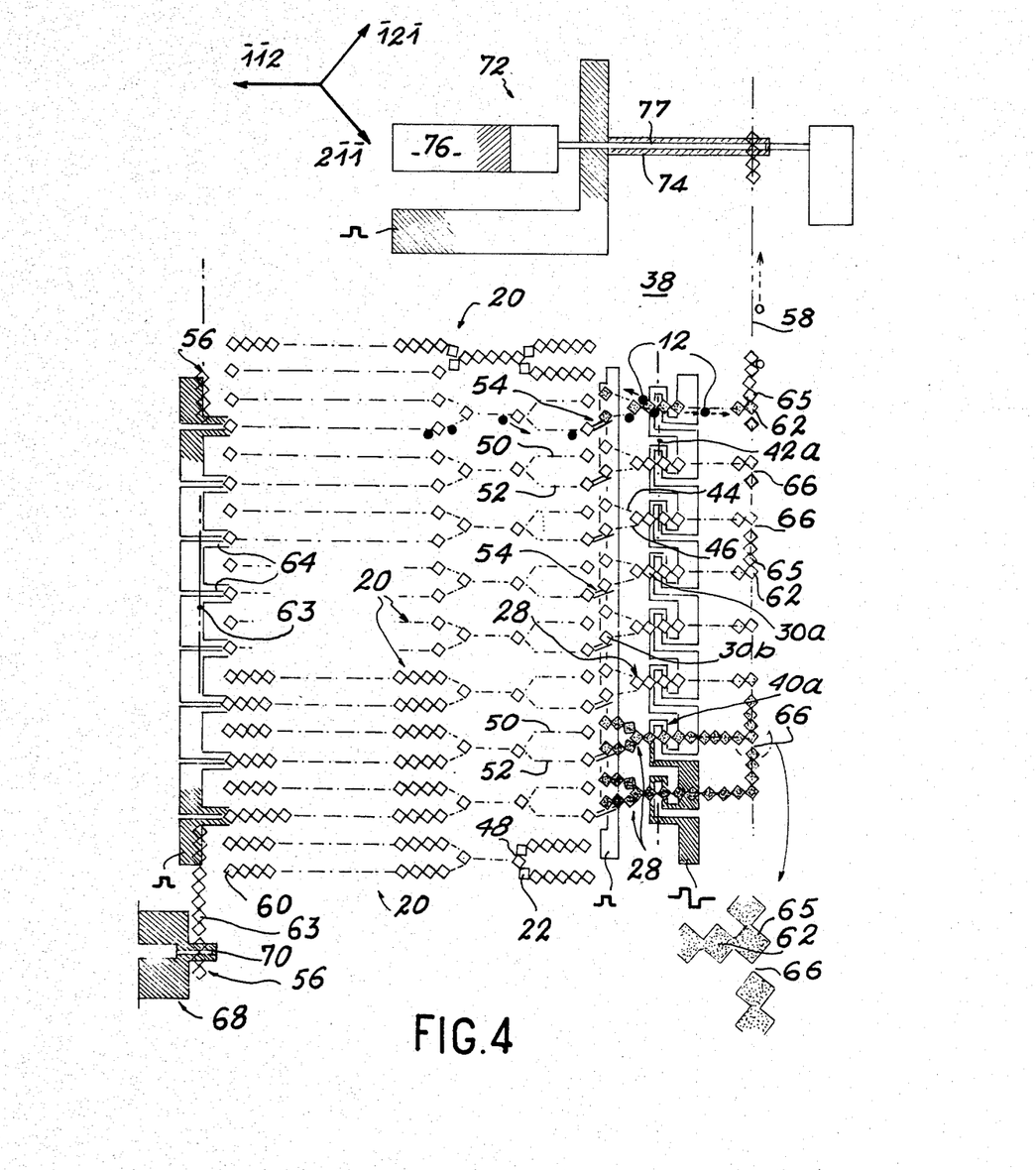
FIG. 4 diagrammatically, a bubble memory according to the invention with a series—parallel organisation.

The current pulse necessary for duplication can either have a single amplitude level (FIG. 1), or several amplitude levels of the same sign (FIG. 3), or several amplitude levels of opposite signs (FIG. 4).

When it is desired to carry out the propagation and duplication of magnetic bubbles having a diameter of approximately 2 microns, the distance 1 (FIG. 2) separating the deepest regions of e.g. two cavities 6a and 8a, defined between two adjacent motifs 2a, 2b, can have a size between 2 and 20 microns.

In order to facilitate the duplication of magnetic bubbles 12, the two motifs 2a, 2b, traversed by electrical conductor 14, can in each case be provided with an implanted region 18. These implanted regions 18 are positioned symmetrically with respect to the axis of symmetry 16 of electrical conductor 14 and symmetrically with respect to axis 10 of the group of propagation motifs 2. The obtaining of these implanted regions is brought about simultaneously with the obtaining of propagation motifs 2, by carrying out ion implantation through an appropriate mask.

The structure as described hereinbefore can advantageously be used in a magnetic bubble memory having a major-minor organization. FIG. 3 shows such an organisation. For simplification purposes, the different elements constituting the memory, as well as the bubbles, have been shown in the same plane.

This bubble memory has several minor loops 20 used for the storage of magnetic bubbles 12, arranged in juxtaposed manner. These minor loops 20 are in each case formed by contiguous, unimplanted propagation motifs 22, having e.g. identical shapes and sizes. With these minor loops 20 is associated a single major loop 24 serving as an access loop to the minor loop 20. Major loop 24 is used both for writing and reading information. Major loops 24, formed by contiguous, unimplanted propagation motifs 26, having e.g. identical shapes and dimensions, is arranged perpendicularly with respect to the minor loops 20. The propagation motifs of the minor loops 20 and major loop 24 have a shape such that two cavities are defined between two adjacent motifs, e.g. a lozenge shape.

According to the invention, the transfer of magnetic bubbles 12 from major loop 24 to a minor loop 20, and the reciprocal transfer, is ensured by means of an intermediate line 28. An intermediate line 28 corresponds to each minor loop 20.

According to the invention, these intermediate lines 28, formed by contiguous, unimplanted propagation motifs 30a, 30b, have a shape such that two cavities are defined between two adjacent motifs and are provided at their end 31, facing the major loop 24, with a bidirectional transfer gate 32 ensuring the transfer of magnetic bubbles 12 from the major loop 24 to the intermediate line 28 (reading) and vice versa (writing). These bidirectional transfer gates 32 can in each case be formed by an electrical conductor, e.g. a U-shaped conductor, traversing the propagation motifs 26 of major loop 24, the U-shaped base being positioned facing said end 31 of the corresponding intermediate line 28.

The transfer of magnetic bubbles by means of bidirectional gates 32 takes place, as in the prior art, by applying a current pulse to the conductor forming these gates. This current pulse makes it possible to extend the bubble, facing bidirectional gates 32, between the tops of propagation motifs 30a of the corresponding line 28 and the tops of the propagation motifs 26 of the major loop 24. The stopping of this current pulse leads to the contraction of the bubble on the major loop 24. It should be noted that all the bidirectional gates 32 are electrically interconnected and that a transfer of bubbles can take place simultaneously to the major loop or to intermediate lines, level with all said bidirectional gates 32.

The propagation motifs 30a of the intermediate lines 28 are, like motifs 2 of FIGS. 1 and 2, aligned and arranged symmetrically with respect to an axis 29, which is positioned parallel to one of the easy magnetization crystallographic axes of the magnetic material layer 38 in which they are formed, said axis being e.g. axis 112, as shown in FIG. 3. Moreover, motifs 30b can have identical shapes and sizes. Moreover, the motifs 30a of an intermediate line 28 are traversed by an electrical conductor 40 having e.g. an axis of symmetry 42, arranged perpendicularly to one of the crystallographic axes of the material layer 38, such as e.g. crystallographic axis 112. The different conductors 40 are electrically interconnected by means of conductors 41.

These conductors 40, like conductor 14 of FIGS. 1 and 2, make it possible to carry out the duplication of magnetic bubbles 12, in order to read the information contained in the minor loops 20 of the memory. This duplication is simultaneously carried out at all conductors 40. Conductors 40 are arranged, as hereinbefore, relative to the cavities defined between two adjacent motifs 30a of the intermediate line. The duplication of the magnetic bubbles by means of these electrical conductors 40 takes place, as hereinbefore, by applying thereto a current pulse at a clearly defined phase of the magnetic field. During the application of a bubble, called mother bubble, one of the two bubbles obtained is directed towards the bidirectional gate 32 and then to the major loop 24 for detection, whilst the other bubble is reinjected into the minor loop 20 from where the mother magnetic bubble or the bubble to be duplicated has been extracted and takes the place of the latter.

As hereinbefore, the duplication of the magnetic bubbles by conductors 40 can be facilitated by using motifs 30a of the corresponding intermediate line 28 having implanted regions (FIG. 1) arranged symmetrically with respect to axis 42 of the corresponding conductor 40 and with respect to the axis 29 of said motifs.

According to the invention, end 36 of the intermediate lines 28, facing the corresponding minor loops 20, has two separate branches respectively 46 and 44, formed by contiguous, unimplanted motifs 30b. These two separate branches 46, 44 are respectively used for the injection of magnetic bubbles 12 into the corresponding minor loop 20 and for the extraction of said bubbles from this loop.

According to the invention, the minor loops 20 are bent in such a way that they define, adjacent to end 48 facing the corresponding intermediate line 28, two separate portions 52, 50, used respectively for the injection and extraction of magnetic bubbles with respect to the minor loop. The minor loops are said to be bent, because they are formed in such a way that on moving in a direction parallel to the axis of one of these loops, four possible positions are encountered for the magnetic bubbles moving on said loop. Moreover, the bubbles introduced on said minor loops can move indefinitely under the action of the magnetic field $H_T$ applied to said bubbles.

In order to permit the injection of magnetic bubbles into the minorloops 20, end 52a of portion 52 of the corresponding minor loop 20 must be positioned facing end 46a of branch 46 of the corresponding intermediate line 28. Preferably, two facing propagation motifs, i.e.

the end motif of the motifs 30b of branch 46 and the end motif of the motifs 22 of branch 52 of the corresponding minor loop 20 are aligned in such a way that said alignment forms an angle θ of close to 30° relative to one of the crystallographic axes of the magnetic layer 38 in which are formed motifs 30b and 22, such as for example crystallographic axis $1\bar{1}2$.

The end motifs of the motifs 30b and 22 respectively of branch 46 of intermediate line 28 and portion 52 of the minor loop 20 constitute a joining function, i.e. the magnetic bubbles 12 from major loop 24 via intermediate line 28 during nucleation (information entry) for duplication (information reading) enter the minor loop 20, whilst the bubbles on said minor loop (information storage) remain there.

In the same way, in order to permit the extraction of the magnetic bubbles from the minor loops 20, end 50a of portion 50 of the corresponding minor loop 20 must be arranged facing the end 44a of branch 44 of the corresponding intermediate line 28. The transfer of magnetic bubbles between portion 50 of the minor loop and branch 44 of the intermediate loop is ensured by means of a unidirectional gate 54 constituted e.g. by a U-shaped electrical conductor. The magnetic bubbles are transferred by applying a current pulse to gate 54. It should be noted that all the gates 54 are electrically interconnected and that a transfer of bubbles can take place simultaneously to intermediate lines 28 level with all these conductors.

In order to prevent all disturbances, between the injection and extraction of magnetic bubbles 12, adjacent to the minor loops 20, branch 44 of the intermediate line and portion 50 of the minor loop on the one hand, and branch 46 of the intermediate line and portion 52 of the minor loop on the other, must be sufficiently remote from one another and oriented correctly with respect to one another. This can easily be carried out by the skilled Expert.

Moreover, the lengths of portions 50 and 52 of minor loops 20, as well as the position of the corresponding conductor 40 used for the duplication of the magnetic bubbles, must be accurately defined. In particular, the lengths of portions 50 and 52 of the minor loops 20 must be such that, during the duplication of a magnetic bubble (reading information), the magnetic bubble obtained by duplication which returns on minor loop 20 must traverse a path equal to that which it would have traversed if it had remained on the minor loop, i.e. said bubble must return on the minor loop to the place which was occupied by the bubble to be duplicated.

FIG. 4 shows a bubble memory having an organisation with two major loops 56, 58. This is called a series—parallel organisation. As hereinbefore, all the elements constituting the memory, as well as the magnetic bubbles have been shown in the same plane in order to simplify the drawing. The major loop 56 is used for introducing magnetic bubbles on minor loops (information entry), whilst the major loop 58 is used for the detection of magnetic bubbles (information reading).

It is possible to see the minor loops 20 having at their end 48, two portions 50, 52, respectively used for the extraction and injection of the magnetic bubbles with respect to the minor loops, the intermediate lines 28 respectivelyfacing portions 50, 52 of the corresponding minor loops 20 having two branches 44, 46, as well as duplication conductors 40a, having e.g. an axis of symmetry 42a, each associated with one of the intermediate lines 28. Minor loops 20, intermediate lines 28 and conductors 40a have the same characteristics as those described hereinbefore.

In this drawing, the major loop 56 faces end 60 of minor loops 20, whilst the major loop 58 is located at the other end of the chain of motifs, i.e. in the extension of ends 62 of intermediate lines 28.

In this memory, the transfer of magnetic bubbles 12 from major loop 56 to minor loop 20 is ensured by means of transfer gates 64, which can be unidirectional or bidirectional. These transfer gates 64 are constituted by a U-shaped conductors, traversing the propagation motif 63 of major loop 56, the base of the U being positioned facing end 60 of the corresponding minor loops 20. The electrical conductors 64 are all electrically interconnected.

In addition, the transfer of the magnetic bubbles 12 from intermediate lines 28 to the major loop 58 is ensured by means of a joining function, i.e. the propagation motifs 30a, adjacent to ends 62 of intermediate lines 28, are joined to those of the major loop 58. In order to ensure the transfer of magnetic bubbles, the propagation motifs 65 of major loop 58 are provided with openings 66, as shown in the larger-scale part of FIG. 4. The magnetic loops 12 moving along the propagation motifs 65 of the major loop 58 are not disturbed by these openings 66, which have a size close to that of the magnetic bubbles, e.g. a diameter of 2 microns.

FIG. 4 generally shows a magnetic bubble generator 68 functioning as a part of the nucleation process. This bubble generator 68 is constituted, in known manner by an electrical conductor 70, traversing the propagation motifs 63 of major loop 56, to which can be applied a high current leading to the formation of a bubble. Moreover, FIG. 4 shows a magnetic bubble detector 72 associated with major loop 58, detector 72, which has a standard construction, is constituted by an electrical conductor 74, traversing the propagation motifs 65 of the major loop 58 and a bar-shaped element 76, made from a magnetoresistive material, generally based on iron and nickel. The detection of a magnetic bubble takes place by the application of a current pulse to conductor 74, which makes it possible to lengthen the bubble to a length of roughly 100 microns, in the useful space 77 of conductor 74. The detected bubble is then destroyed in such a way that detector 72 is able to detect another bubble. The destruction of a magnetic bubble corresponds to the transformation thereof into an electrical signal.

The magnetic bubble memories according to the invention have a major-minor or series—parallel organisation and can be used like the prior art memories for carrying out bubble-by-bubble duplication, i.e. bit-by-bit. Moreover, these bubble memories, in view of the relative arrangement of the elements forming them, as well as the structure of each of these elements and particularly the arrangement of the intermediate lines 28 with respect to the crystallographic axis of the layer of material in which they are formed, the structure of these lines and the arrangement of duplication conductors 40 (FIG. 3) 40a (FIG. 4) with respect to said axis, make it possible to carry out the duplication of a group or block of bubbles, i.e. a block of bits. This was not possible with the prior art bubble memories using unimplanted motifs.

Figure 5:
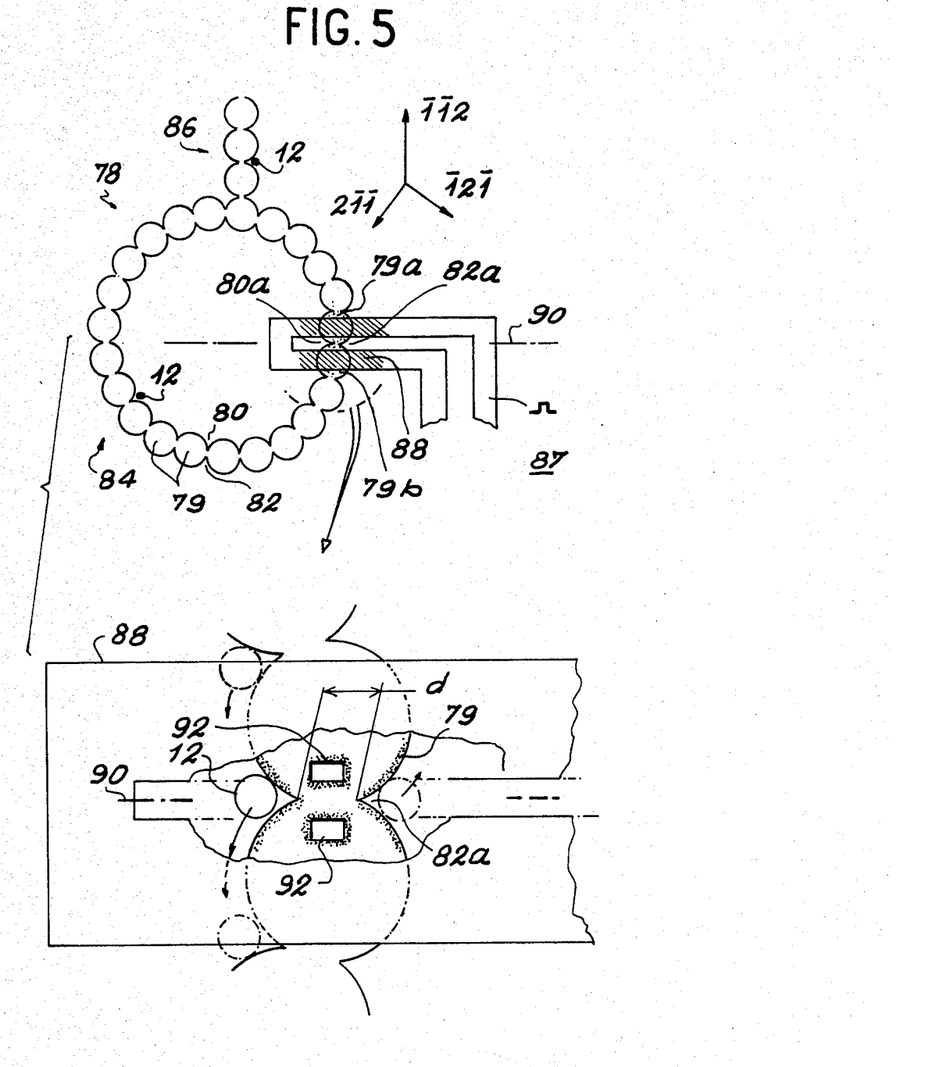
FIG. 5 diagrammatically, the means making it possible to produce the bubbles in a memory according to the invention.

According to the invention, the magnetic bubble generator operating on the nucleation principle, such as e.g. generator 68 of FIG. 4, can be replaced by a generator operating on the principle of the duplication of magnetic bubbles. Such a generator is shown in FIG. 5. As hereinbefore, with a view to the simplification of the drawing, the elements constituting this generator, as well as the bubbles, have been shown in the same plane.

This generator 78 is constituted by a group of contiguous, unimplanted propagation motifs 79, having a shape such that two cavities 80, 82 are defined between two adjacent motifs 79. These motifs 79 obtained as hereinbefore, are preferably in the form of circles, as shown in the drawing, or are in the form of polygons, such as triangles or hexagons. Moreover, these motifs 79 have identical shapes and sizes. In part, motifs 79 are arranged so as to form a closed loop 84, whereas the remaining motifs 79 are arranged along a propagation path 86. As shown in the drawing, the propagation path 86 can be arranged parallel to one of the crystallographic axes of the magnetic material layer 87 (magnetic garnet) in which are formed the motifs 79, e.g. crystallographic axis $\overline{112}$. The displacement of the magnetic bubbles along motifs 79, both for the looped part 84 and for the aligned part 86, takes place as hereinbefore by means of a rotary magnetic field $H_T$ applied parallel to the magnetic material layer containing the bubbles.

In order to obtain the duplication of the magnetic bubbles 12 moving along the motifs 79 of loop 84, use is again made of an electrical conductor 88, having e.g. an axis of symmetry 90, arranged perpendicularly to one of the crystallographic axes of the magnetic material layer 87, e.g. crystallographic axis $\overline{112}$.

As hereinbefore, (FIGS. 1 and 2) the axis of symmetry 90 of this electrical conductor passes through the two cavities 80a, 82a, defined by the two adjacent motifs 79a, 79b, at the deepest region of these cavities. Conductor 88 traverses the two adjacent motifs 79a, 79b. The duplication of magnetic bubbles 12, located in one of the cavities 80a, 82a, takes place by applying an electrical current pulse to electric conductor 82, as shown in the drawing. This pulse is only applied when it is desired to produce a bubble, i.e. record information in the memory. This pulse can have one or more amplitude levels of the same or opposite signs. One of the bubbles, obtained by duplication, is passed to the access or major loops of the memory, via the propagation path 86, the other duplication bubble being reinjected into loop 84.

Moreover, in order to facilitate the duplication of the magnetic bubble, implanted regions 92 formed in the unimplanted motifs 79a, 79b, traversed by electrical conductor 88, can be provided, in the manner shown in the larger-scale part of FIG. 5. These regions are positioned symmetrically with respect to the axis of symmetry 90 of conductor 88.

The introduction of magnetic bubbles into the loop 84 of motifs 97 can be carried out during the initialization of the memory, by supplying current pulses of an appropriate amplitude. This can be carried out up to the complete filling of loop 84 by magnetic bubbles. When loop 84 is filled with bubbles, it is possible to produce information elements 1, i.e. a bubble, by duplicating a bubble contained in loop 84 by means of conductor 88.

In order to ensure a good stability of the magnetic bubbles contained in the closed loop 84, it is preferable according to the invention for said loop to have the ternary symmetry (three crystallographic axes) of the magnetic material layer 87 in which the propagation motifs 97 are formed. It should be noted that this magnetic layer 87 is the same as that containing the major and minor loops of the memory.

In order to carry out the propagation and duplication of magnetic bubbles having a diameter of approximately 2 microns, the distance d separating the deepest regions of two cavities, e.g. 80a, 82a, defined between two adjacent motifs 79a, 79b can be between 2 and 20 microns (largest-scale part of FIG. 5).

What is claimed is:

1. A magnetic bubble memory having a first layer of monocrystalline magnetic material with at least one crystallographic axis having the property of being a planar easy magnetization axis, whereby said first layer has groups of unimplanted, contiguous and aligned motifs, called first motifs, permitting the propagation of the bubbles in a second magnetic layer, positioned below the first magnetic layer, said first motifs being shaped in such a way that two cavities are defined between two first adjacent motifs, wherein each group of first motifs has an axis such that the first motifs of said group are arranged symmetrically with respect to said axis, said groups being arranged parallel to the crystallographic axis of the first layer of material, and wherein it comprises, associated with each group, an electrical conductor, called the first conductor, permitting the duplication of the bubbles, each conductor being arranged perpendicular to the crystallographic axis of the first layer of material, the corresponding group of first motifs being tranversed by said conductor.

2. A bubble memory according to claim 1, wherein each first electrical conductor has an axis of symmetry and is arranged in such a way that said axis of symmetry passes through the deepest region of the two cavities defined by two first adjacent motifs of the group associated therewith.

3. A bubble memory according to claim 2, wherein the first two adjacent motifs of the same group located at the point where the first associated electrical conductor is arranged, have in each case an implanted region, said regions being positioned symmetrically with respect to the axis of symmetry of the first conductor and symmetrically with respect to the axis of said group of first motifs.

4. A bubble memory according to claim 1, wherein the first motifs have identical shapes and sizes.

5. A bubble memory according to claim 1, wherein the distance separating the deepest regions of two cavities defined between two first adjacent motifs of the same group is between 2 and 20 $\mu$m for bubbles of approximately 2 $\mu$m.

6. A bubble memory according to claim 1, also comprising minor loops used for the storage of bubbles, arranged in juxtaposed manner and each having two ends, said minor loops being formed by contiguous unimplanted propagation motifs, called second motifs, at least one major loop used as an access loop for the minor loops, arranged perpendicularly to the latter, said major loop being formed by contiguous unimplanted propagation motifs, called third motifs, and means for detecting and producing bubbles on the major loop, wherein each minor loop is bent so as to define, at one of its ends, two separate juxtaposed portions, the first portion being used for the injection of bubbles into the minor loop and the second portion for extracting bubbles from said minor loop, and wherein each minor loop is associated with a group of first motifs used for the transfer of bubbles from the corresponding minor loop to the major loop and vice versa, said groups of first motifs having at one of their ends two separate branches, a first branch being used for the injection of bubbles into the corresponding minor loop and a second branch being used for the extraction of bubbles from the corresponding minor loops, said branches, formed by contiguous, aligned, unimplanted propagation motifs, called fourth motifs, being juxtaposed in such a way that the end of the first branch faces the end of the first portion of the corresponding minor loop and the end of the second branch faces the end of the second portion of the corresponding minor loop, the end of the second branch being provided with a unidirectional transfer gate for ensuring the transfer of bubbles from the minor loop to the group of associated motifs.

7. A bubble memory according to 6, wherein the fourth end motif of the first branch and the secnd end motif of the first portion of the minor loop facing one another are aligned, said alignment forming an angle of approximately 30° with the crystallographic axis of the first magnetic layer.

8. A bubble memory according to claim 6, wherein the unidirectional transfer gates are formed by U-shaped electrical conductors.

9. A bubble memory according to claim 6, wherein the two portions of the minor loops have a length such that a bubble, obtained by the duplication of a mother bubble, returns to the minor loop at the place occupied by the mother bubble.

10. A bubble memory according to claim 6, wherein the groups of first motifs have at their other end a bidirectional transfer gate for ensuring the transfer of bubbles from the major loop to said group of motifs and vice versa.

11. A bubble memory according to claim 6, wherein the memory comprises two major loops, the first facing the bubble detection means and the second facing the means making it possible to produce the bubbles and is such that the groups of first motifs are joined, at their other end, to the first major loop, the latter having openings formed in the third unimplanted motifs forming the same, permitting the transfer of bubbles from the group of first motifs to said major loop and wherein the other end of the minor loops has a transfer gate permitting the transfer of bubbles from these minor loops to the second major loop and vice versa.

12. A bubble memory according to claim 6, wherein the means for producing the bubbles comprise a group of contiguous, unimplanted, propagation motifs, called fifth motifs, having a shape such that two cavities are defined between two adjacent motifs, part of the said motifs being arranged so as to form a closed loop, the other part constituting a propagation path for the bubbles produced, and an electrical conductor, called the second conductor, permitting the duplication of bubbles disposed perpendicularly to the crystallographic axis of the first magnetic layer, said group of fifth motifs being traversed by the second conductor, at the part where they form a closed loop.

13. A bubble memory according to claim 12, wherein as the first magnetic layer has three crystallographic axes, the closed loop has the symmetry of order 3 of said magnetic layer.

14. A bubble memory according to claim 12, wherein the second electrical conductor has an axis of symmetry and is arranged in such a way that its axis of symmetry passes through the deepest region of the two cavities defined by two first adjacent motifs of the group associated therewith 15. A bubble memory according to claim 12, wherein the fifth motifs have identical shapes and sizes.

16. A bubble memory according to claim 12, wherein the fifth motifs are in the form of circles, triangles or hexagons.

17. A bubble memory according to claim 12, wherein the fifth adjacent motifs, positioned at the location of the second electrical conductor, have in each case an implanted region, said regions being arranged symmetrically with respect to the axis of symmetry of the second conductor.

18. A bubble memory according to claim 12, wherein the distance separating the deepest regions of two cavities defined between two fifth adjacent motifs is between 2 and 20 $\mu$m for bubbles of approximately 2 $\mu$m.

19. A process for the duplication of magnetic bubbles comprising the steps of providing a first layer of monocrystalline magnetic material with at least one crystallographic axis having the property of being a planar easy magnetization axis, whereby said first layer has groups of unimplanted, contiguous and aligned motifs called first motifs, permitting the propagation of the bubbles in a second magnetic layer, positioned below the first magnetic layer, said first motifs being shaped in such a way that two cavities are defined between two first adjacent motifs, wherein each group of first motifs have an axis such that the first motifs of said group are arranged symmetrically with respect to said axis, said groups being arranged parallel to the crystallographic axis of the first layer of material, and wherein it comprises, associated with each group a first electrical conductor, permitting the duplication of the bubbles, each conductor being arranged perpendicular to the crystallographic axis of the first layer of material, the corresponding group of first motifs being traversed by said conductor, the propagation of bubbles along the motifs being ensured by applying parallel to the second material layer, a continuous rotary magnetic field having a given rotation period, and wherein each conductor used for duplication is supplied with at least one current pulse leading to the elongation of the bubbles on either side of the group of motifs associated with said conductor and the splitting of said bubbles into two.

20. A duplication process according to claim 19, wherein said power supply to said conductor used for duplication is turned off, when the magnetic field is parallel to the axis of the groups of motifs associated with said conductor.

21. A duplication process according to claim 19, wherein the current pulse has a single amplitude level.

22. A duplication process according to claim 19, wherein the current pulse has several different amplitude levels of the same sign.

23. A duplication process according to claim 19, wherein the current pulse has several amplitude levels of opposite signs.

24. An application, of the process according to claim 19, to bit-by-bit duplication, duplication being also carried out by supplying the electrical conductors used for duplication with successive current pulses.

25. An application of the process according to the clam 19 to bit block duplication.

* * * * *